US005973980A

United States Patent [19]

Tiede et al.

[11] Patent Number: 5,973,980

[45] Date of Patent: Oct. 26, 1999

[54] FAST VOLTAGE REGULATION WITHOUT OVERSHOOT

[75] Inventors: John William Tiede; Jon Allan Faue, both of Colorado Springs, Colo.

[73] Assignees: United Memories, Inc., Colorado Springs, Colo.; Nippon Steel Semiconductor Corporation, Chiba, Japan

[21] Appl. No.: 09/121,253

[22] Filed: Jul. 23, 1998

Related U.S. Application Data

[62] Division of application No. 08/833,083, Apr. 4, 1997, Pat. No. 5,818,291.

[51] Int. Cl.[6] .................... G11C 7/00

[52] U.S. Cl. .................... 365/226; 365/205

[58] Field of Search .................... 365/226, 205; 327/540

[56] References Cited

U.S. PATENT DOCUMENTS

| | | | |
|---|---|---|---|
| 5,097,303 | 3/1992 | Taguchi | 357/23.6 |
| 5,321,324 | 6/1994 | Hardee et al. | 326/62 |
| 5,442,277 | 8/1995 | Mori et al. | 323/312 |
| 5,587,648 | 12/1996 | Jinbo et al. | 323/269 |

FOREIGN PATENT DOCUMENTS

| | | |
|---|---|---|
| 0 454 170 A2 | 10/1991 | European Pat. Off. . |

*Primary Examiner*—David Nelms
*Assistant Examiner*—Hoai V. Ho
*Attorney, Agent, or Firm*—Stuart T. Langley; William J. Kubida; Holland & Hart LLP

[57] ABSTRACT

An on-chip voltage regulator for controlling a gate of a regulator transistor having a first terminal coupled to receive an external power supply voltage and a second terminal coupled to provide a regulated voltage level to an internal circuit formed on a chip on which the on-chip voltage regulator is formed. The on-chip voltage regulator includes circuitry for detecting when a high current load to which the second terminal of the regulator transistor is coupled is activated. A control transistor is provided having a first terminal coupled to receive the external power supply voltage, a second terminal coupled to the gate of the regulator transistor, and a gate responsive to the means for detecting. In operation, a control voltage with an overshoot portion having preselected duration is generated on the gate of the regulator transistor in response to the activation of the high current load.

5 Claims, 4 Drawing Sheets

FAST VOLTAGE REGULATION WITHOUT OVERSHOOT

This is a division of application Ser. No. 08/833,083, filed on Apr. 4, 1997, now U.S. Pat. No. 5,818,891, which is hereby incorporated by reference in its entirety.

BACKGROUND OF THE INVENTION

1. Field of the Invention

The present invention relates, in general, to integrated circuits and, more particularly, to integrated circuits having voltage regulator circuits generating an internal power supply voltage from an external power supply voltage.

2. Relevant Background

Integrated circuits (ICs) comprise thousands or millions of individual devices interconnected to provide desired functionality. Significant effort is expended to improve processing techniques so as to reduce the size of each individual device in order to provide greater functionality on a given IC chip at reduced cost. In general, smaller geometry devices operate faster with less power than do larger geometry devices. As device geometries are reduced the breakdown voltages of the devices and the isolation that separates the devices decreases also.

Electronic systems usually comprise ICs manufactured with a variety of technologies. This has created a need for multiple power supply voltages to be supplied to a single printed circuit board to support the various types of devices on that board. For example, many complementary metal oxide semiconductor (CMOS) devices are still available that minimum drawn dimensions of more than 0.8 microns and require a power supply voltage of 5.0 volts. In contrast, state of the art ICs such as microprocessors and memory circuits have gate lengths in the order of 0.35 microns and require a power supply voltage of 3.3 volts or lower.

To ensure a broad market for a particular IC, it should be compatible with commonly available power supply voltages for other IC's. A practical solution to this disparity is to provide voltage regulator circuitry integrated with the low voltage ICs that decreases the higher voltage (e.g., 5.0 V in the above example) to the lower voltage required by the small geometry device (e.g., 3.3 V). Hence, it is necessary to regulate the externally supplied power supply voltage inside of each of the small geometry ICs.

A conventional on-chip voltage regulator is designed to generate a lower voltage than the external voltage. Typically, a transistor is coupled in series between the external voltage node and the internal voltage supply node. The conductivity of the transistor is modulated to drop the excess voltage across the transistor. To limit undesirable voltage ripple on the internal voltage supply node, the time constant of the regulator is desirably much longer than the internal cycle of the device. This prevents undesired voltage ripple within a cycle that can upset analog voltage levels. Because of this, the internal voltage supply node should be heavily filtered by coupling a large capacitor between the internal voltage supply node and ground. In practice, however, filter capacitors consume a great deal of chip area without adding functionality. Cost and chip size considerations dictate limiting the filter capacitor to more modest sizes.

The limited capacitor size reduces the charge storage capability of the regulator and makes it more sensitive to high current demand by downstream circuits and devices. An example of such circuitry are sense amplifiers in a dynamic random access memory (DRAM). In a typical DRAM circuit, one sense amplifier is supplied for each bit line pair in the device. For each sense amplifier, the stand-by (i.e., non-switching) state requires relatively little current. When activated, however, each sense amplifier may draw more than 1000 times its standby current. As used herein, the term "activated" means a state in which a circuit is drawing high current whereas "stand-by" means a state in which a circuit draws little current even though power is applied. Moreover, state of the art DRAM devices may have more than 1000 sense amplifiers activated simultaneously, resulting in very high current draw on the regulator. During high current demand, regulation can become poor and the chip's internal voltage levels can vary significantly. It would be desirable to bypass the internal regulator altogether during these high current demand operations.

SUMMARY OF THE INVENTION

The present invention involves an on-chip voltage regulator for controlling a gate of a regulator transistor having a first terminal coupled to receive an external power supply voltage and a second terminal coupled to provide a regulated voltage level to an internal circuit formed on a chip on which the on-chip voltage regulator is formed. The on-chip voltage regulator includes circuitry for detecting when a high current load to which the second terminal of the regulator transistor is coupled is activated. A control transistor is provided having a first terminal coupled to receive the external power supply voltage, a second terminal coupled to the gate of the regulator transistor, and a gate coupled to the means for detecting. In operation, the regulation circuit generates a control voltage with an overshoot portion having preselected duration on the gate of the regulator transistor in response to the activation of the high current load.

In another aspect, the present invention involves a method for supplying power from an external voltage source to internal circuitry an integrated circuit. Using a first power supply a first current is supplied to first portions of the internal circuitry. Using a second power supply a second current is supplied to second portions of the internal circuitry. Activation of the internal circuitry is detected and the impedance of the second power supply is lowered to increasing the second current supplied by the second power supply in response to the activation of the second portions.

DETAILED DESCRIPTION OF THE PREFERRED EMBODIMENTS

Figure 1:
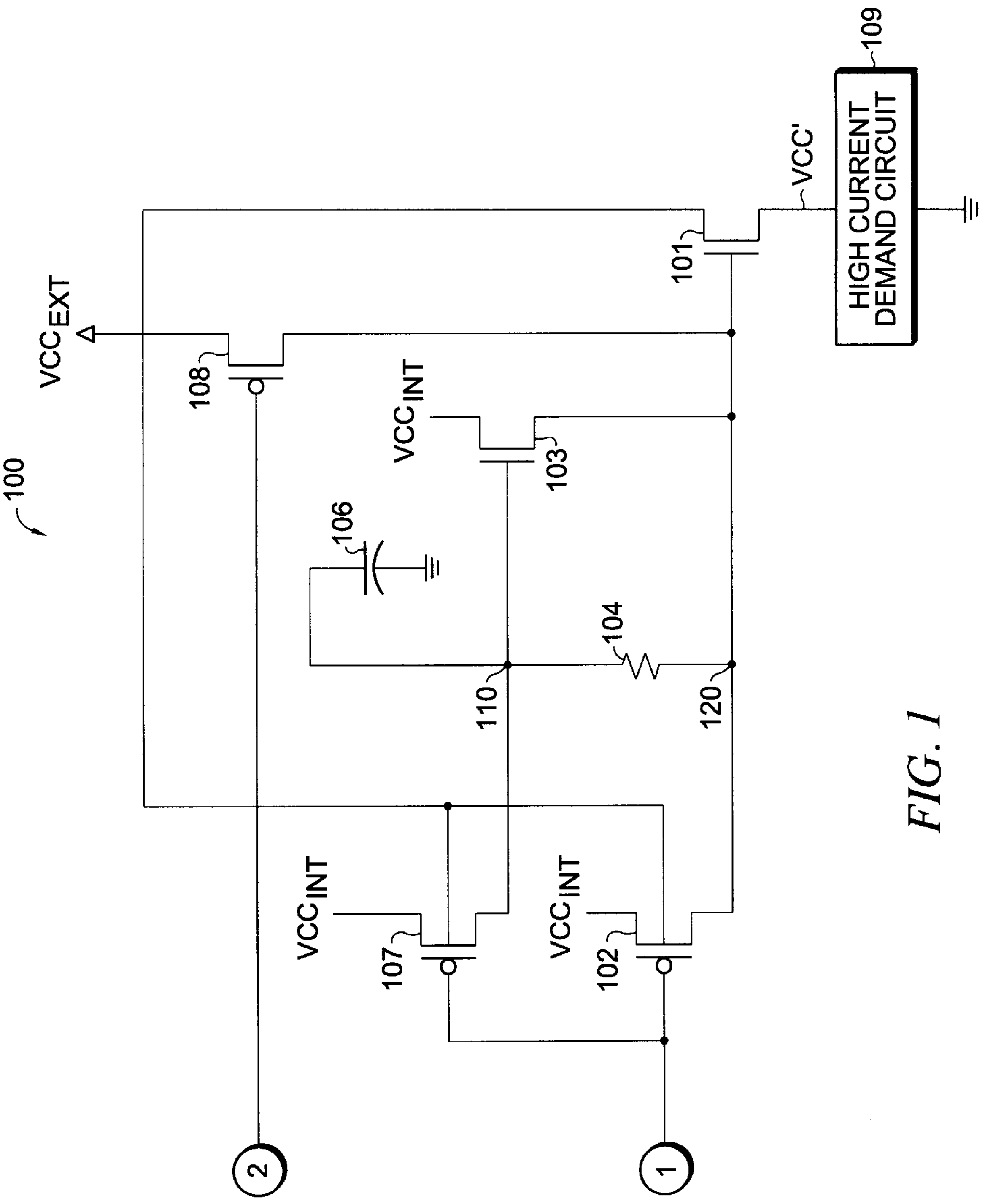
FIG. 1 shows a schematic diagram of a voltage regulator in accordance with the present invention.

FIG. 1 shows a voltage regulator 100 in accordance with the present invention that is particularly useful as an on-chip voltage regulator for integrated circuits having high current loads. The present invention is useful in any semiconductor device for which internal voltage regulation is used and there are circuits on with high current demand. In general, voltage regulator 100 allows high current demand circuits 109 to be supplied directly through the external voltage node ($VCC_{EXT}$) so as to avoid disruption of the internal voltage supply $VCC_{INT}$. The internal voltage supply supplying $VCC_{INT}$ can be implemented using any available voltage regulator circuitry and technology. Desirably, the internal voltage supply for $VCC_{INT}$ can be physically smaller and use less filter capacitance because it does not supply current to high current demand circuits 109. In a typical application, $VCC_{INT}$ is approximately 2.9 volts and $VCC_{EXT}$ is approximately 4.4 volts, although the present invention will operate wherever $VCC_{INT}$ IS lower than $VCC_{EXT}$.

Voltage regulator 100 comprises a regulator transistor 101 having a first current carrying terminal coupled to $VCC_{EXT}$ and a second current carrying terminal coupled to provide a regulated voltage VCC' to high current demand circuit 109. Regulator transistor 101 has a gate electrode coupled to node 120 for receiving a control signal. For example, regulator transistor 101 may be an N-channel field effect transistor having a drain coupled to $VCC_{EXT}$ and a source coupled to high current demand circuit 109. Preferably, regulator 101 has a high current handling capability that is provided in a particular example by an N-channel transistor having a gate length of 1 microns and a gate width of 2,000 microns.

Regulator 100 receives a first control signal indicated by an encircled 1 in FIG. 1 and a second control signal indicated by an encircled 2 in FIG. 1. The first control signal activates precharge circuitry in regulator 100 for precharging node 120 of regulator 101 to a preselected voltage. The second control signal causes a voltage pulse of a preselected magnitude and duration on node 120. In operation, the conductivity of regulator transistor 101 increases (i.e., impedance decreased) during the voltage pulse on node 120 allowing regulator transistor 101 to supply high current to high current demand circuit 109. As discussed in greater detail hereinafter, the pulse generating circuitry (shown in FIG. 3) that generates the second control signal is related to the activation of high current demand circuitry 109 such that regulator transistor 101 provides the high current in synchronization with activation of the high current demand circuitry 109.

The precharge circuitry comprises p-channel transistor 102 and p-channel transistor 107 in the example shown in FIG. 1. When placed in a "ready" state, the first control signal is normally a logic low voltage applied to the gate of transistor 102 such that transistor 102 is ON. In this state, node 120 is held at close to $VCC_{INT}$. The voltage VCC' supplied to high current demand circuit 109 will be lower than $VCC_{INT}$ by an amount equal to the threshold voltage ($V_{TN}$) of regulator transistor 101. The first control signal is synchronized with the activation of the high current demand circuit such that in the ready state high current demand circuit is not active, and low or negligible current flows through regulator transistor 101.

P-channel transistor 102 is also turned ON in the ready state such that node 110 is held at $VCC_{INT}$. Transistor 102 serves to precharge node 110 coupled to the gate of transistor 103. Transistor 103 together with resistance 104 and capacitance 106 form a clamp circuit that determines the magnitude and duration of the voltage pulse on node 120 resulting from the second control signal. By precharging node 110, clamp transistor 103 can activate more quickly and give greater control to the shape and duration of any pulse on node 120.

Although the precharge circuitry and clamp circuitry discussed above are desirable, they may be omitted in certain applications. These circuits add control and precision to the control of regulator transistor 101 so as to avoid excessive voltage being coupled to high current demand circuit 109.

In synchronization with the second control signal and the activation of high current demand circuit 109, the first control signal rises to a logic high voltage. In turn, transistors 102 and 107 are turned off thereby decoupling the $VCC_{INT}$ supply voltage from nodes 110 and 120.

Figure 3:
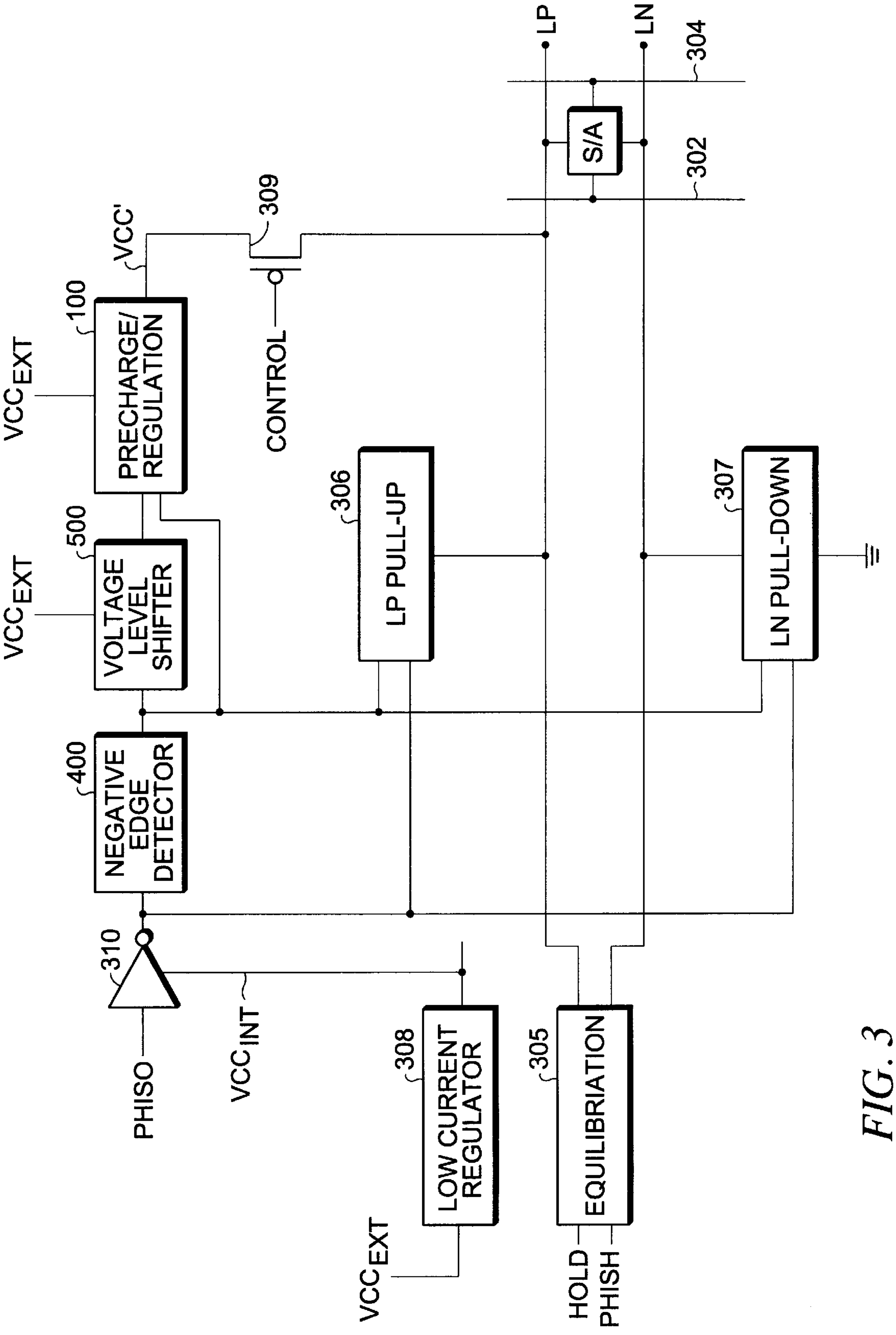
FIG. 3 shows in block diagram form a portion of a memory circuit including a voltage regulator in accordance with the present invention.

The second control signal applied to the gate of p-channel transistor 108 is a voltage sufficient to keep transistor 108 turned off. Because the source of transistor 108 is at $VCC_{EXT}$, the second control signal preferably is less than a threshold voltage ($V_{TP}$) of p-channel transistor 108 below $VCC_{EXT}$ or leakage current will flow through transistor 108 in the ready state. In a specific example, level shift circuit 500 shown in FIG. 3 is used to pull-up the second control signal to $VCC_{EXT}$ to ensure that transistor 108 is off. Hence, in many applications the second control signal must be held at a voltage above $VCC_{INT}$ during the ready state.

As the first control signal rises to a logic high, the second control signal falls to a logic low or to a voltage sufficient to turn on transistor 108. Hence, as soon as the precharge circuitry is deactivated, transistor 108 couples the external voltage $VCC_{EXT}$ to node 120 to charge the gate of regulator transistor 101 from the precharge voltage of $VCC_{INT}$ to a higher voltage sufficient to lower the impedance of transistor 101.

The voltage VCC' supplied to high current demand circuit 109 is equal to the voltage at node 120 less the threshold voltage of regulator transistor 101. Hence, as transistor 108 pulls up the voltage on node 120, it is possible that VCC' could rise to undesirably high voltages. The present invention addresses this issue in two manners. First, the second control signal is supplied with a preselected pulse width such that transistor 108 is activated for a preselected length of time. Second, the clamp circuit formed by transistor 103, resistor 104, and capacitor 106 limits the voltage on node 120 allowing only a brief, controlled overshoot voltage on node 120 to rapidly charge the gate of transistor 101, but of insufficient duration to allow VCC' to rise above $VCC_{INT}$.

As the voltage at node 120 increases, the voltage on node 110 rises over a period of time defined by the RC time constant of resistor 104 and capacitor 106. The gate capacitance of transistor 103 will also affect the time constant as will any other parasitic impedance in the circuit. After the delay selected by resistor 104 and capacitor 106, node 110 rises to one n-channel threshold voltage ($V_{TN}$) above $VCC_{INT}$ and clamp transistor 103 turns on. Clamp transistor limits the voltage on node 120 to $VCC_{INT}+V_{TN}$. Once clamp transistor 103 is turned on, VCC' is limited to a voltage of $VCC_{INT}+V_{TN}-V_{TN}=VCC_{INT}$. Hence, the clamp circuit prevents undesirable excessive voltage overshoot at VCC'.

Figure 2:
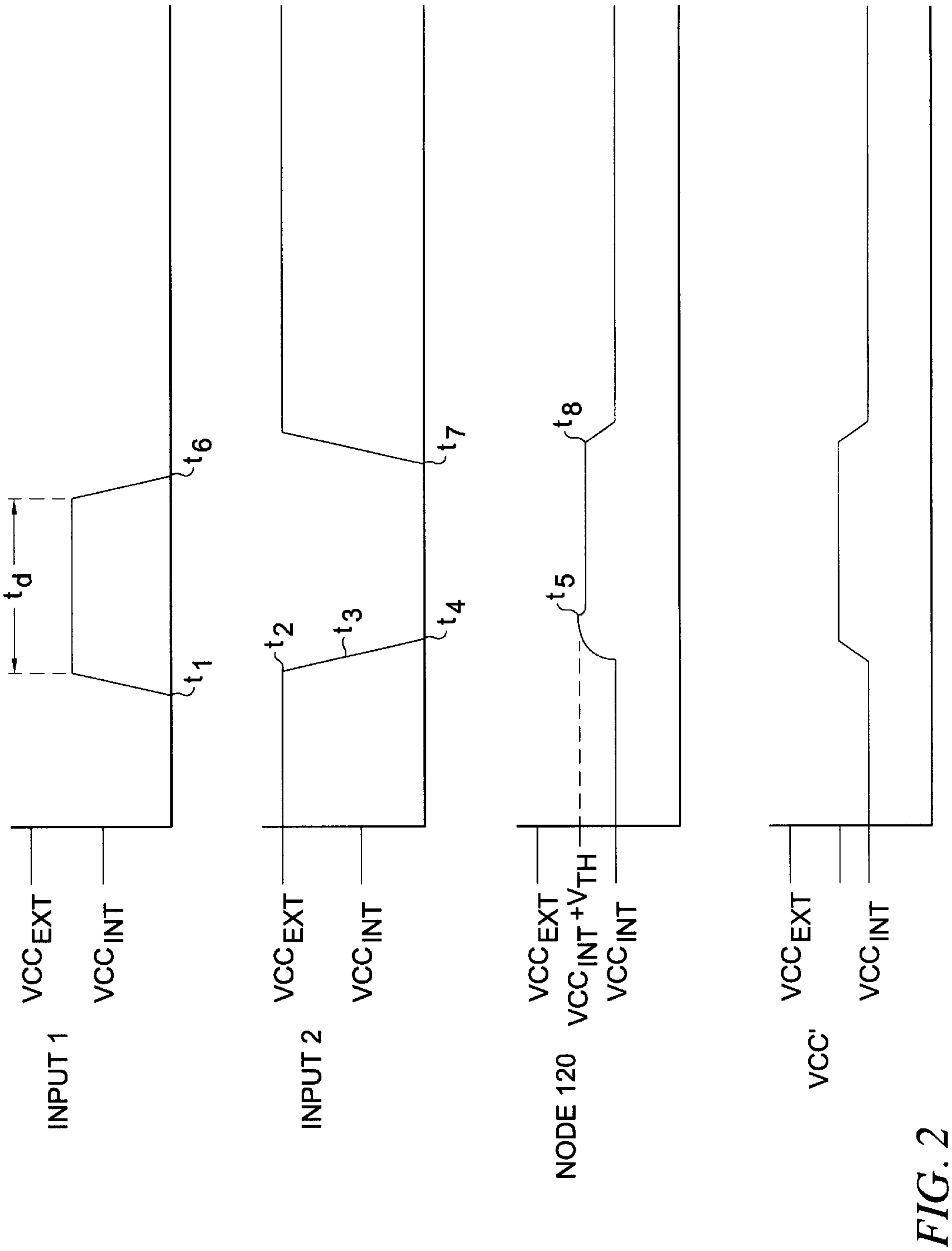
FIG. 2 shows waveform diagrams for the circuit shown in FIG. 1.

FIG. 2 shows selected voltage waveforms used in the operation of regulator 100. As set out hereinbefore, the first and second control signals are both synchronized with activation of high current demand load 109 in the preferred embodiment. In each of the waveforms shown in FIG. 2, voltage is represented on the vertical axis and time is represented on the horizontal axis. Unless otherwise indicated, the duration, magnitude, and relative timing of the waveforms shown in FIG. 2 are provided as examples only—significant variation is allowed in accordance with the present invention. Accordingly, waveforms that provide substantially equivalent functionality are equivalent to the specific waveforms described herein.

The first control input controls the precharge circuitry and is illustrated in the upper waveform of FIG. 2. In the ready state (i.e., time t0) the first control is at a logic low or 0.0 V in the specific example. At time $t_1$ the first control input begins to rise toward a logic high (i.e., $VCC_{INT}$). For the time period indicated by td in FIG. 2, the first control signal is held at a sufficiently high voltage to maintain the precharge circuitry in a deactivated state. The precise time at which deactivation occurs will be determined by the threshold characteristics of transistors 107 and 102 in FIG. 1. Because use of a precharge circuit is optional in accordance with the present invention, the first control signal may not be used in some implementation in accordance with the present invention.

The second control signal is also synchronized with activation of the high current demand circuit and in a preferred embodiment is derived from the first control signal. In the ready state, the second control input is held at or near the external supply voltage $VCC_{EXT}$. At time $t_2$ the second control signal begins to fall to a logic low occurring at time $t_4$. It is not necessary that the second control input fall completely to the logic low level as transistor 108 (shown in FIG. 1) may be sufficiently turned on at some higher voltage determined by the characteristics of transistor 108.

Time $t_2$ occurs shortly (i.e., a few gate delays) after time $t_1$ when the second control signal is derived from the first control signal. It is acceptable if the second control signal occurs before time $t_1$. It is preferable that time $t_2$ occurs during $t_d$ so that the precharge circuit is deactivated during the high current supply mode.

At a some time between $t_2$ and $t_4$, indicated by $t_3$ in FIG. 2, the magnitude of the second control signal will have fallen sufficiently to activate transistor 108 (shown in FIG. 1). At $t_3$, the voltage on node 120 begins to rise as the current flowing through transistor 108 attempts to charge node 110 and node 120 to $VCC_{EXT}$. The waveshape of the voltage rise on node 120 from $VCC_{INT}$ (the precharge voltage) can be described by the current supplied by transistor 108, the gate capacitance of transistor 101, and the loading created by elements 104, 106, and 103 of the clamp circuit using conventional circuit analysis techniques.

Node 110 is charged from node 120 via resistor 104 and capacitor 106. At time $t_5$ the voltage on node 120 is greater than the threshold voltage of transistor 103. Hence, at time $t_5$ transistor 103 turns on and clamps node 120 to $VCC_{INT}+V_{TN}$. During the time between $t_3$ and $t_5$, the voltage on node 120 may be allowed to rise above $VCC_{INT}+V_{TN}$ for a brief time selected by the values of resistor 104 and capacitor 106. During this "overshoot" time period, the gate of transistor 101 is rapidly charged. After time $t_5$, VCC' rises from a voltage just less than $VCC_{INT}+V_{TH}$ to $VCC_{INT}$.

VCC' remains at $VCC_{INT}$ until transistor 108 is deactivated and the precharge transistors 107 and 102 are reactivated by the return of the first and second control signals to their ready state. At time indicated by $t_6$ the first control signal falls to a logic low and the precharge circuitry is reactivated. At time $t_7$ the second control signal begins to rise to $VCC_{EXT}$ so as to deactivate transistor 108. Time $t_7$ will occur shortly after time $t_6$ when the second control signal is derived from the first control signal, although this relative timing is not required to practice the present invention.

During the time from $t_3$ to $t_8$, the impedance of transistor 101 is lowered due to the increased voltage on node 120. This allows transistor 101 to quickly supply current directly from $VCC_{EXT}$ to high current demand load 109. Once the high current demand is over, (i.e., $t_8$ in FIG. 2), the voltage on node 120 is reduced and transistor 101 returns to normal regulation of VCC' to $VCC_{INT}-V_{TN}$.

FIG. 3 shows in block diagram form a portion of a memory circuit including a voltage regulator 100 in accordance with the present invention. The present invention is particularly useful in memory circuits because of their brief requirement to supply high currents to the sense amplifier circuitry indicated by S/A in FIG. 3. A plurality of memory cells (not shown) are coupled to bit lines 302 and 304. For ease of understanding, only a single pair of bit lines 302 and 304 are shown in FIG. 3, however, it is understood that an entire array having plural bit line pairs is intended but not illustrated. Also, common memory circuits including decoders for columns and rows, input/output buffers, and other well-known peripheral circuitry common to DRAMs are necessary but not illustrated to aid understanding of the present invention.

The circuit shown in FIG. 3 serves to generate a signal LP that is applied to a P-channel latch within the sense amplifiers. The circuit of FIG. 3 also generates a signal LN that is applied to an N-channel latch in the sense amplifiers, however, the present invention will be described only as it is implemented in the LP signal generating circuitry shown in FIG. 3. The voltage on the LP line is coupled through the P-channel latch in the sense amplifiers to the bit lines 302 and 304 and drives the voltage of the bit lines to the voltage value of the LP line. Likewise, the voltage on the LN line is coupled through the N-channel latch in the sense amplifiers to the bit lines 302 and 304 to drive the voltage of the bit lines to the voltage value of the LN line.

The circuit shown in FIG. 3 receives a bit line reference hold voltage indicated as HOLD in FIG. 3 and PHISH that is an equilibriation control signal applied to equilibriation circuit 305. In DRAMs using equilibriation of the bit lines, the LP and LN lines are equalized at a voltage determined by the voltage applied to the HOLD line before activation of the sense amplifiers so as to minimize the time and power required for bit lines 302 and 304 to respond to a signal driven by the sense amplifiers. In some DRAM designs, equilibriation is not used in which case equilibriation circuit 305 and its associated inputs and interconnections are not required in the implementation of the present invention.

LP pull-up circuit 306 serves to rapidly charge LP to the internal voltage supply $VCC_{INT}$ during sensing. Similarly, LN serves to rapidly charge LN to VSS during sensing. LP pull up circuit 306 and LN pull down circuit 307 are coupled to the output of negative edge detector 400. In a preferred embodiment, negative edge detector 400 generates the first control signal described in reference to FIG. 1 and FIG. 2. LP pull-up circuit 306 and LN pull-down circuit 307 are only active while the sense amplifier is inactive, or in the ready state. LP pull-up circuit 306 and LN pull-down circuit 307 receive power from a fast, low current voltage regulator 308. Low current supply 308 is an acceptable voltage source because the sense amplifier circuits draw little current when inactive.

Precharge/regulation circuit 100 is substantially implemented as the regulator circuit 100 shown FIG. 1. The first control input to precharge regulation circuit is provided by the output of negative edge detector 400. The second control input to precharge regulation circuit 100 is provided by voltage level shifter 500. The output voltage VCC' generated by precharge regulation circuit 100 is coupled to the high current load (i.e., sense amplifiers in FIG. 3) through a gating transistor 309. Transistor 309 is controlled by an externally generated or internally derived control signal that maintains transistor 309 off during the ready state (i.e., no high current load) and turns on transistor 309 when the sense amplifiers are activated, coupling VCC' to the LP line.

Negative edge detector 400 receives an inverted clock signal PHISO from inverting buffer 310. PHISO is derived from a clock signal activating the sense amplifiers. In the specific example of FIG. 3 PHISO is low during the ready state and changes to a logic high when the sense amplifiers are activated. Hence, the output of inverting buffer 310 is a high-to-low transition (i.e., a negative edge) upon activation of the sense amplifiers.

Negative edge detector 400 generates a positive-going pulse having a preselected pulse width upon detection of the negative edge at the output of inverting buffer 310. An example of an acceptable output waveform is shown as the first control signal in FIG. 2, although any waveform, including multiple pulses is considered equivalent so long as suitable functionality is provided by precharge/regulator circuit 100.

Voltage level shifter 500 receives the output of negative edge detector 400 and shifts it to a negative-going signal having a logic HIGH level near $VCC_{EXT}$. Any available voltage shifting circuitry may be used. For example, U.S. Pat. No. 5,321,324 issued to Kim C. Hardee et al. on Jun. 14, 1994 and assigned to the assignees of the present invention illustrates a number of voltage shift circuits that can be adapted to provide acceptable implementations of voltage shifter 500 in accordance with the present invention.

Figure 4:
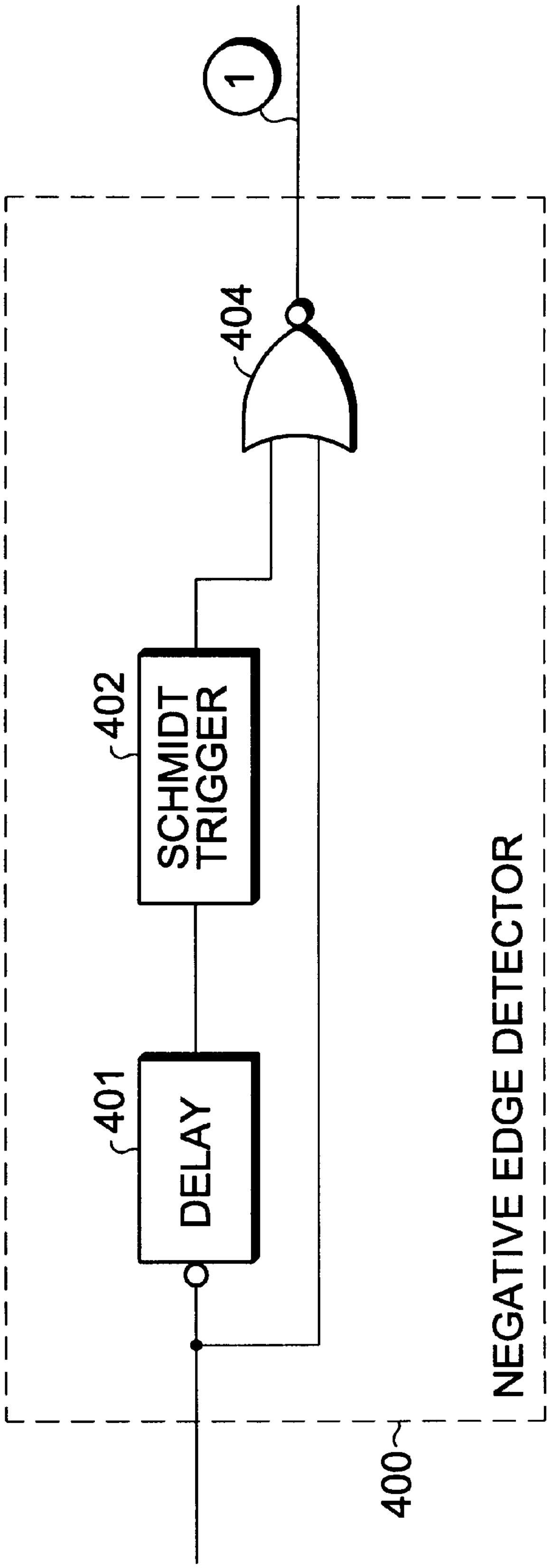
FIG. 4 shows a block diagram of a portion of the memory circuit of FIG. 3 in accordance with the present invention.

FIG. 4 illustrates an example of circuitry suitable for the implementation of negative edge detector 400 shown in FIG. 3. The output of inverting buffer 301 is received by delay 401 and one input of NOR gate 404. Delay 401 is preferably implemented as a voltage and time invariant delay, although other delay circuits will provide acceptable performance is particular applications. The delayed output from delay circuit 401 is coupled to Schmidt trigger 402. Schmidt trigger 402 is essentially a comparator with hysteresis. Hence, Schmidt trigger 401 will resist changing its output for some period of delay after the output from delay 401 changes. The output of Schmidt trigger 402 is coupled to a second input of NOR gate 404. The present invention uses delay 401 and Schmidt trigger 402 to define td by creating the negative edge of the first input signal shown in FIG. 2.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

We claim:

1. A semiconductor memory comprising:

plurality of memory cells;

a sense amplifier coupled to the plurality of memory cells, wherein the sense amplifier has a control input for receiving a latching signal;

a sense amplifier control receiving a sense amplifier strobe signal and outputting the latching signal to the sense amplifier;

a first power supply having a power input coupled to an external voltage supply and a power output supplying current to the semiconductor memory at a regulated voltage level;

a second power supply having a greater current sourcing capacity than the first power supply and having a power input coupled to the external voltage supply, a power output supplying current to the sense amplifier control input, and a control input, wherein the second power supply selectively couples current directly from the external voltage supply to the second power supply's power output in response to a signal on the control input; and a pulse generator responsive to the sense amplifier strobe to generate a pulse of a preselected duration coupled to the control input of the second power supply.

2. The semiconductor memory of claim 1 wherein the second power supply further comprising: a precharge circuit for precharging the control input of the second power supply before the signal is applied to the control input of the second power supply.

3. The semiconductor memory of claim 2 wherein the precharge circuit is deactivated in response to the signal applied to the control input.

4. The semiconductor memory of claim 1 wherein the second power supply further comprising a clamp circuit coupled between the power output of the first power supply and the control input of the second power supply, wherein the clamp circuit prevents voltage on the control input from rising more than a preselected amount above the regulated voltage level.

5. The semiconductor memory of claim 1 further comprising:

wherein the second power supply including a control transistor having first terminal coupled to receive the external voltage supply, a second terminal coupled to the control input of the second power supply, and a gate; and a voltage level shifter having an input coupled to the output of the pulse generator and an output coupled to the gate of the control transistor.

* * * * *